(12) United States Patent
Chen et al.

(10) Patent No.: US 9,070,842 B2
(45) Date of Patent: Jun. 30, 2015

(54) LIGHT-EMITTING DIODE MANUFACTURING METHOD

(71) Applicant: Zhongshan Innocloud Intellectual Property Services Co., Ltd., Zhongshan (CN)

(72) Inventors: Pin-Chuan Chen, Hsinchu (TW); Lung-Hsin Chen, Hsinchu (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 0 days.

(21) Appl. No.: 14/035,943

(22) Filed: Sep. 24, 2013

(65) Prior Publication Data

US 2014/0179042 A1 Jun. 26, 2014

(30) Foreign Application Priority Data

Dec. 21, 2012 (CN) .......................... 2012 1 0561110

(51) Int. Cl.
*H01L 21/00* (2006.01)
*H01L 33/50* (2010.01)
*H01L 33/60* (2010.01)

(52) U.S. Cl.
CPC .................. *H01L 33/50* (2013.01); *H01L 33/60* (2013.01); *H01L 2933/0041* (2013.01); *H01L 2933/005* (2013.01)

(58) Field of Classification Search
None
See application file for complete search history.

(56) References Cited

U.S. PATENT DOCUMENTS

| 2008/0099771 | A1 | 5/2008 | Jong et al. |
| 2011/0186902 | A1 | 8/2011 | Egoshi et al. |
| 2011/0309398 | A1* | 12/2011 | Ito et al. ................... 257/98 |
| 2012/0153345 | A1 | 6/2012 | Ozaki et al. |

FOREIGN PATENT DOCUMENTS

| TW | 200820467 A1 | 5/2008 |
| TW | 201145616 A1 | 12/2011 |
| TW | 201232856 A1 | 8/2012 |

* cited by examiner

*Primary Examiner* — Yasser A Abdelaziez
(74) *Attorney, Agent, or Firm* — Novak Druce Connolly Bove + Quigg LLP

(57) ABSTRACT

A light-emitting diode manufacturing method comprises steps of: providing a flexible material layer having a flexible reflective layer and phosphor glue in the flexible reflective layer; providing a hard material layer having a substrate and an LED chip on the substrate; combining the flexible material layer and the hard material layer together wherein the LED chip inserts into the phosphor glue and is surrounded by the flexible reflective layer; and solidifying the flexible reflective layer and the phosphor glue to form a reflective cup and a phosphor layer, respectively.

10 Claims, 13 Drawing Sheets

LIGHT-EMITTING DIODE MANUFACTURING METHOD

BACKGROUND

1. Technical Field

The present disclosure relates to a light-emitting diode (LED) manufacturing method, and particularly to a manufacturing method of LED with a phosphor layer which does not easily come off.

2. Description of Related Art

Light-emitting diodes (LEDs) are popular recently. LEDs have advantages such as energy saving, electricity saving, high efficiency, short response time, extensive life span, mercury-free, and environmental protection benefits. Therefore, LEDs are considered as the best light source of new generation illumination. At the present, the phosphor glue of a LED is formed by the processes of forming a reflective cup on the substrate and depositing a LED chip in the reflective cup, and then the reflective cup is filled with phosphor glue via dispensing. However, the connections between phosphor layer and substrate and reflective cup are unstable, whereby the phosphor layer has the problem of easily coming off from the substrate and the reflective cup.

In view of the above-mentioned problem, it is necessary to provide a light-emitting diode manufacturing method which the phosphor layer of the light-emitting diode does not easily come off.

DETAILED DESCRIPTION

Embodiments will now be described in detail below with reference to the appended figures.

Figure 1:
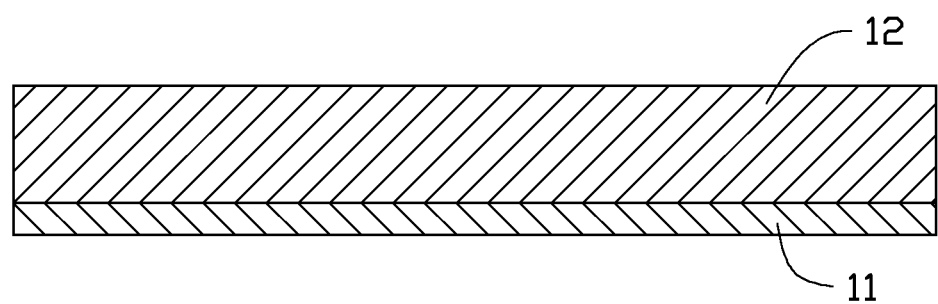
FIG. 1 is step 1 of a first embodiment of the light-emitting diode manufacturing method according to the present disclosure.

FIGS. 1-9 show the first embodiment of the light-emitting diode 100 manufacturing method. The method mainly comprises the steps of:

FIG. 1 and step 1 show: providing a flexible material layer 12 and a first supporting layer 11 for supporting the flexible material layer 12. Because of the plasticity, the flexible reflective layer 12 is made of flexible reflective material. For example, the flexible reflective layer 12 is made of silicone, epoxy resin or polymer, for example. The flexible reflective layer 12 has upper and bottom surfaces. Because the flexible reflective layer 12 is soft and flexible, the first supporting layer 11 is deposited on the bottom surface of the flexible reflective layer 12 to support it.

Figure 2:
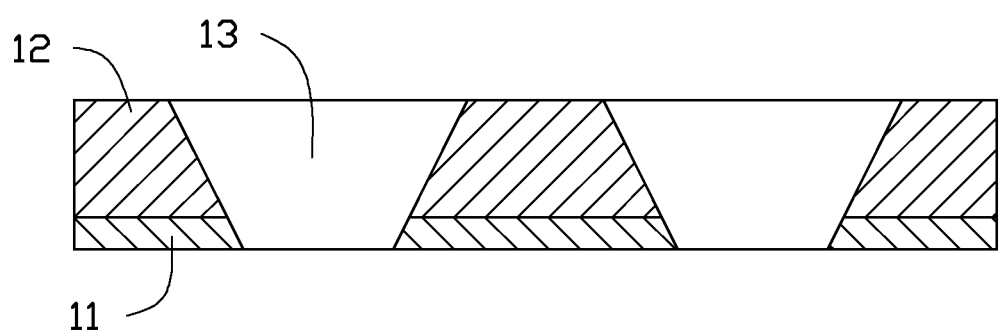
FIG. 2 is step 2 of the first embodiment of the light-emitting diode manufacturing method according to the present disclosure.
Figure 3:
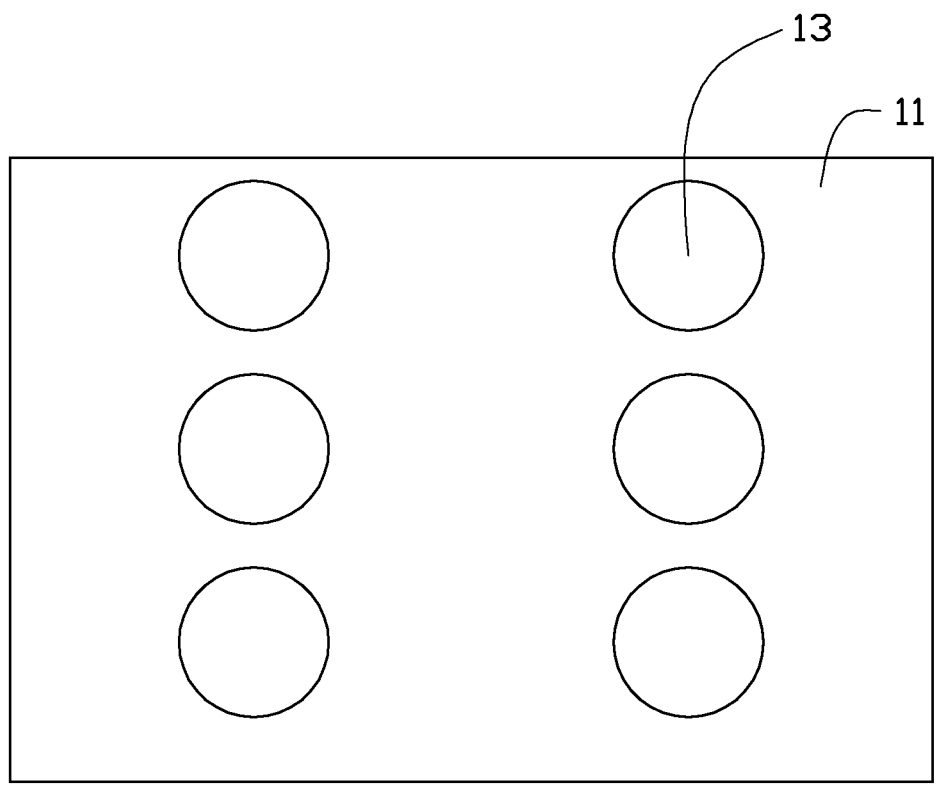
FIG. 3 is a top view of FIG. 2.

FIGS. 2-3 and step 2 show: opening at least one cavity 13 on the flexible material layer 12 and the first supporting layer 13, by stamping, for example. The cavity 13 penetrates through the flexible reflective layer 12 and the first supporting layer 11. The cross-section of the cavity 13 is an upside down trapezoid, which has a small baseline then the upper line. The flexible reflective layer 12 and the first supporting layer 11 are sized so that a plurality of cavities 13 can be opened on the flexible reflective layer 12 and the first supporting layer 11 as shown in FIG. 3. In this embodiment, at least two cavities 13 are opened on the flexible reflective layer 12 and the first supporting layer 11.

Figure 4:
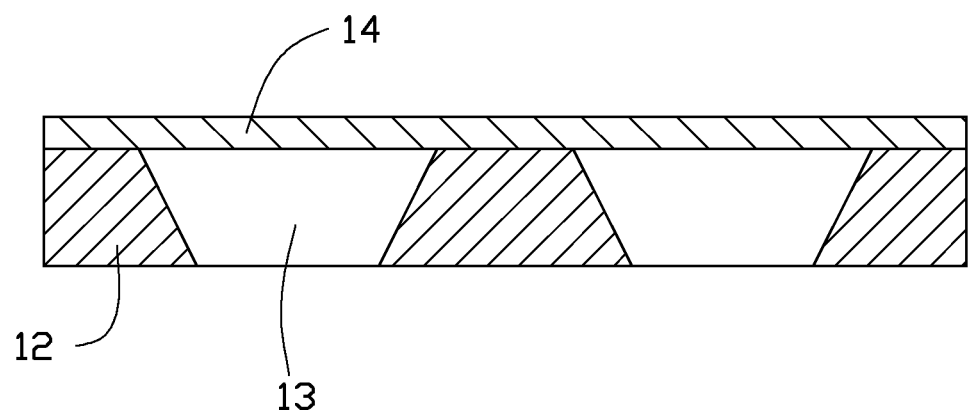
FIG. 4 is step 3 of the first embodiment of the light-emitting diode manufacturing method according to the present disclosure.

FIG. 4 and step 3 show: removing the first supporting layer 11, a second supporting layer 14 is deposited on the upper surface of the flexible reflective layer 12, and overlays the two cavities 13. The cavities 13 only penetrate the flexible reflective layer 13 and are overlain with the second supporting layer 14.

Figure 5:
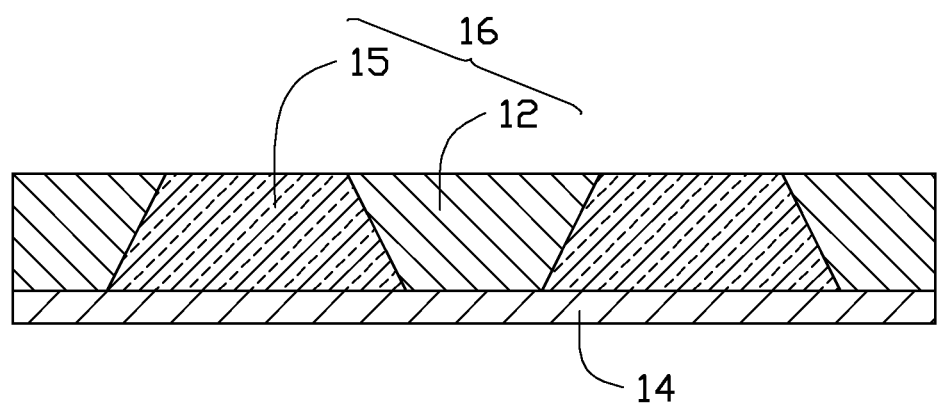
FIG. 5 is step 4 of the first embodiment of the light-emitting diode manufacturing method according to the present disclosure.

FIG. 5 and step 4 show: phosphor glue 15 is formed to fill the two cavities 13, for example, by scrapping. The thicknesses of the phosphor glue 15 and the flexible reflective layer 12 are the same. Because the flexible reflective layer 12 and the phosphor glue 15 are both flexible material, when the phosphor glue 15 fills the cavities 13, the phosphor glue 15 can more possibly match the shape of the cavities 13, securely attaching the phosphor glue 15 and the flexible reflective layer 12 together. The flexible reflective layer 12 and the phosphor glue 15 filled in the flexible reflective layer 12 collectively form the flexible material layer 16 which is supported by the second supporting layer 14.

Figure 6:
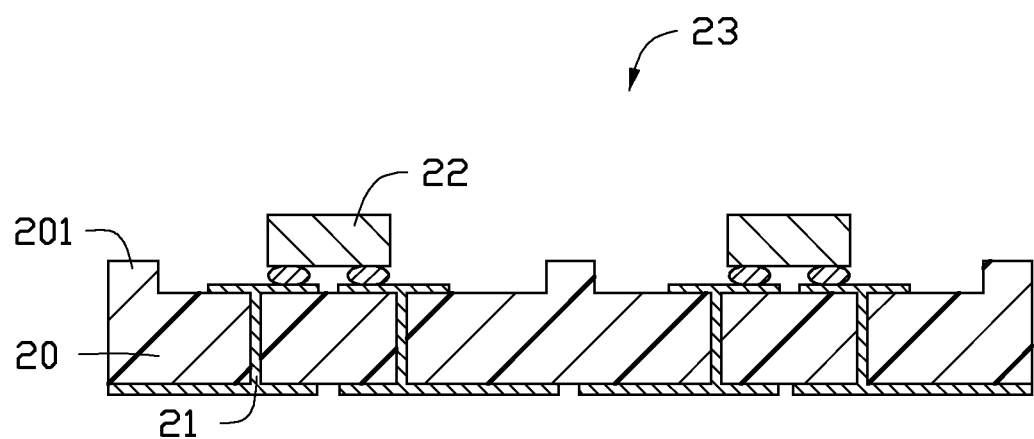
FIG. 6 is step 5 of the first embodiment of the light-emitting diode manufacturing method according to the present disclosure.

FIG. 6 and step 5 show: providing a hard material layer 23 which comprises a substrate 20 and LED chips 22 set on the substrate 20. The substrate 20 comprises protrusions 201. The substrate 20 is inlaid with electrode sets 21 which electrical connect the LED chips 22. The protrusions 201 and the LED chips 22 are on the same surface. In this embodiment, the protrusions surround the LED chips 22 in a shape of ring. The substrate 20 comprises a plurality of electrode sets 21; on each electrode set 21 is located a LEI) chip 22; each electrode set 21 and LED chip 22 are surrounding by a corresponding ring-shaped protrusion 201. The number of the electrode sets 21 and LED chips 22 on the substrate 20 correspond to the number of cavities 13 of the flexible reflective layer 12. In this embodiment, the substrate 20 has two LED chips 22 which are corresponding to the two cavities 13.

Figure 7:
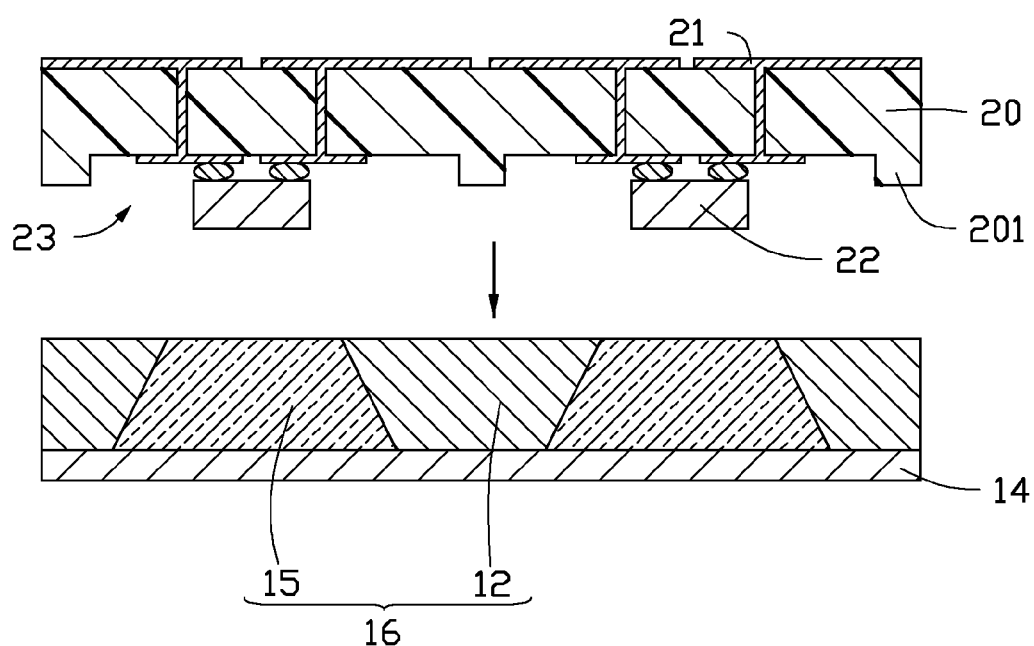
FIG. 7 is step 6 of the first embodiment of the light-emitting diode manufacturing method according to the present disclosure.

FIG. 7 and step 6 show: moving the protrusions 201 of the substrate 20 and the LED chips 22 set on the substrate 20 toward the flexible material layer 16 to combine the hard material layer 23 and the flexible material layer 16 together, wherein the protrusions 201 joint with the reflective material layer 12 and the LED chips 22 are embedded into the phosphor glue 15.

Figure 8:
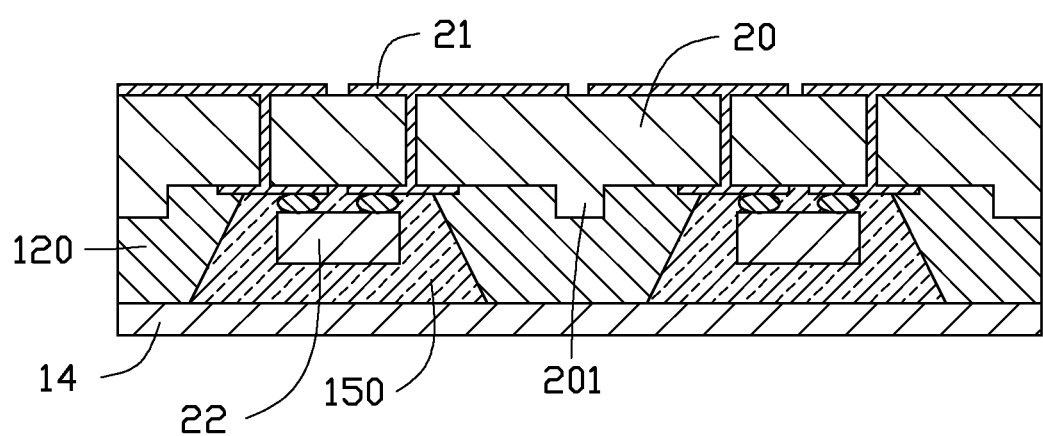
FIG. 8 is step 7 of the first embodiment of the light-emitting diode manufacturing method according to the present disclosure.

FIG. 8 and step 7 show: baking the flexible reflective layer 12 and the phosphor glue 15 at high temperature to make the flexible reflective layer 12 solidify on the substrate 12 to from reflective cups 120 and the phosphor glue 15 solidify on the surface of the LED chips 22 to form phosphor layers 150. Because the reflective cups 120 are made of the flexible reflective layer 12 which has a high plasticity before it is cured, the flexible reflective layer 12 can tightly attach with the substrate 20. Therefore, the mechanical connection and hermeticity between the solidified reflective cups 120 and the substrate 20 are improved; the phosphor layer 150 does not come off from the substrate 20 easily. Moreover, because the substrate 20 comprises the protrusions 201, when the substrate 20 combines with the flexible reflective layer 12, the protrusions 201 joint with the flexible reflective layer 12. In one hand, the protrusions 201 increase the contact area between the substrate 20 and the flexible reflective layer 12 to further improve the hermeticity between the reflective cups 120 and the substrate 20. In the other hand, because the flexible reflective layer 12 are deformed by force to combine the protrusions 201 with the flexible reflective layer 12, the deformed shape of the flexible reflective layer 12 can completely match the protrusions 201; therefore the tight extent of the connection between the substrate 20 and the flexible reflective layer 12 can be further improved. Similarly, since the LED chips 22 protrude from the substrate 20, when the substrate 20 combines with the flexible reflective layer 12, the LED chips 22 are inserted into the phosphor glue 15. Because the phosphor glue 15 is deformed by the extrusion of the LED chips 22, the phosphor glue 15 combines with the LED chips 22 and the substrate 20. Thereby, the tight extent of the connection between the phosphor glue 15 and LED chips 22 and the substrate 20 is improved. The protrusions 201 are not limited to ring shape, but any shape that can joint with the flexible reflective layer 12; the protrusions each can be a bump, for example.

Figure 9:
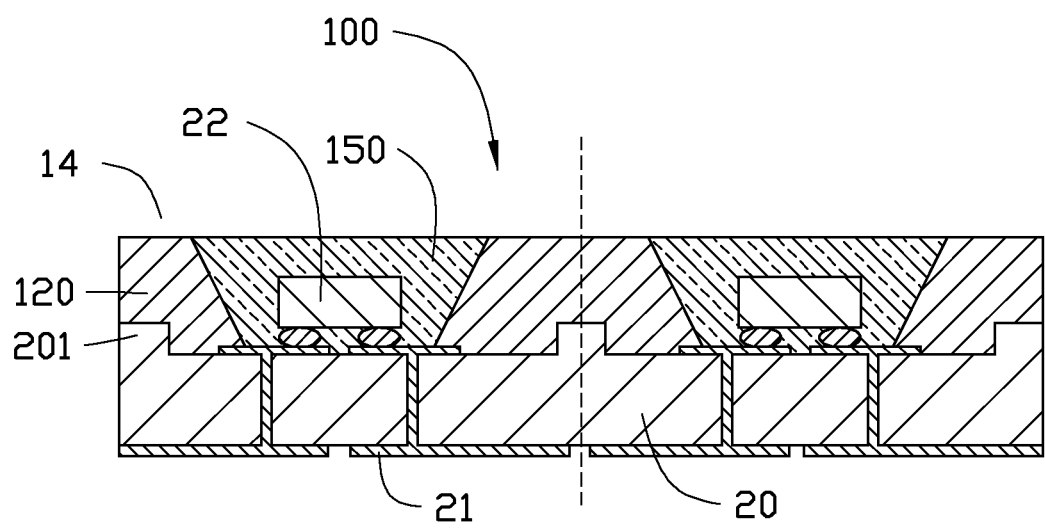
FIG. 9 is step 8 of the first embodiment of the light-emitting diode manufacturing method according to the present disclosure.

FIG. 9 and step 8 show: removing a second supporting layer 14, cutting the substrate 20 and the reflective cups 120 along with the middle position of the middle protrusion 201 of the substrate 20 to obtain a plurality of light-emitting diodes 100. In this embodiment, two light-emitting diodes 100 can be obtained by cutting the substrate 20 and the reflective cups 120. Each light-emitting diode comprises a substrate 20, an electrode set 21, an LED chip 22 set on the substrate 20 and electrical connects with the electrode set 21, a reflective cup 120 set on the substrate 20 and surrounds the LED chip 22, and a phosphor layer 150 overlays the LED chip 22.

Figure 10:
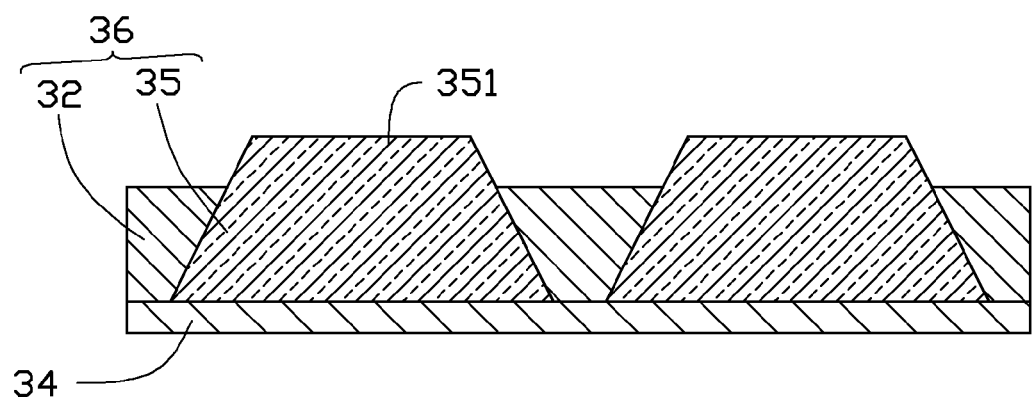
FIG. 10 is step 1 of a second embodiment of the light-emitting diode manufacturing method according to the present disclosure.

FIGS. 10-13 show that the second embodiment of the light-emitting diode 200 manufacturing method of present disclosure mainly comprises the steps of:

FIG. 10 and step 1 show: providing a flexible material layer 36 and a second supporting layer 34 for supporting the flexible material layer 36. The flexible material layer 36 comprises a flexible reflective layer 32 and phosphor glue 35. Opening cavities on the flexible reflective layer 32, the cavities penetrate the flexible reflective layer 32 and are overlaid by the second supporting layer 34. The cavities are filled with the phosphor glues 35. The cross-section of the phosphor glue 35 is a trapezoid, which has a longer baseline than upper line. The phosphor glues 35 fill the cavities and protrude from the cavities to become protrusions. The phosphor glue is higher then the flexible reflective layer 32. In this embodiment, the flexible reflective layer 32 is opened with two cavities. The methods of combining the phosphor glue 35 and the flexible reflective layer 32 can refer to steps 1-4 of the first embodiment.

Figure 11:
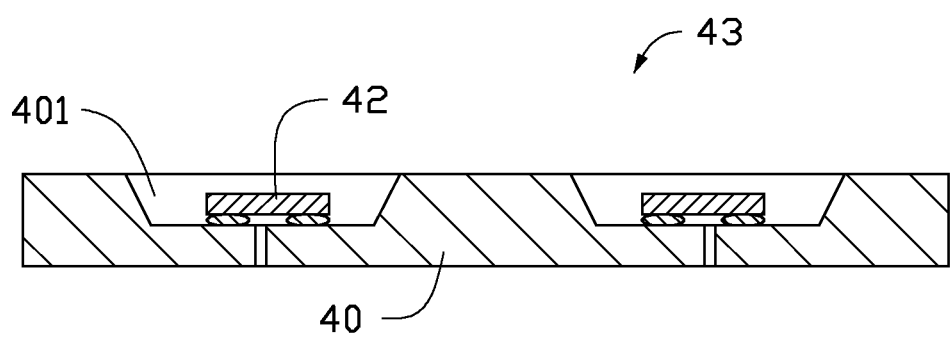
FIG. 11 is step 2 of the second embodiment of the light-emitting diode manufacturing method according to the present disclosure.

FIG. 11 and Step 2 show: providing a hard material layer 43, the hard material layer 43 comprises a substrate 40 and LED chips 42 set on the substrate 40. The substrate 40 has cavities 401. The substrate 40 is made of metal which can be electrode as well. The shapes of the cavity 401 and the protrusion 351 of the phosphor glue 35 are same. The LED chips 42 are located in the cavities 401. The height of the LED chip 42 is smaller than the depth of the cavity 401. In this embodiment, the substrate 40 has two cavities 401, and in each cavity 401 is deposited with a LED chip 42.

Figure 12:
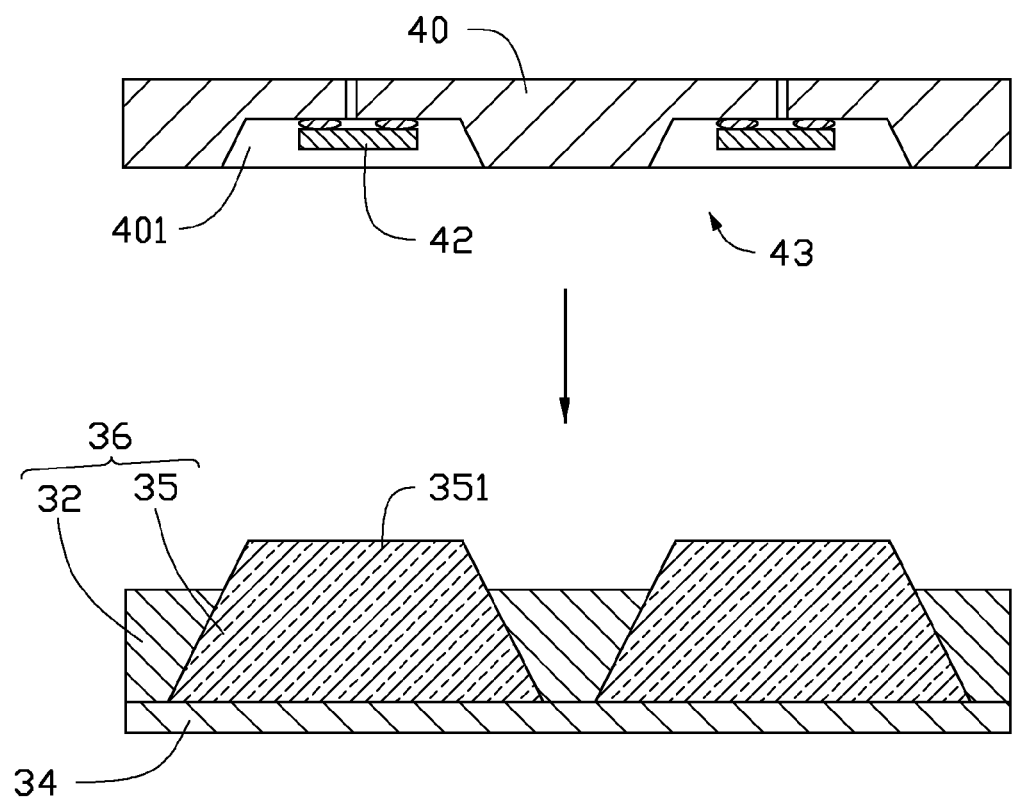
FIG. 12 is step 3 of the second embodiment of the light-emitting diode manufacturing method according to the present disclosure.

FIG. 12 and step 3: moving the substrate 40 toward the flexible material layer 36 to combine the two, wherein the phosphor glue 35 joints with the cavities and the LED chips 42 embed in the phosphor glue 35.

Figure 13:
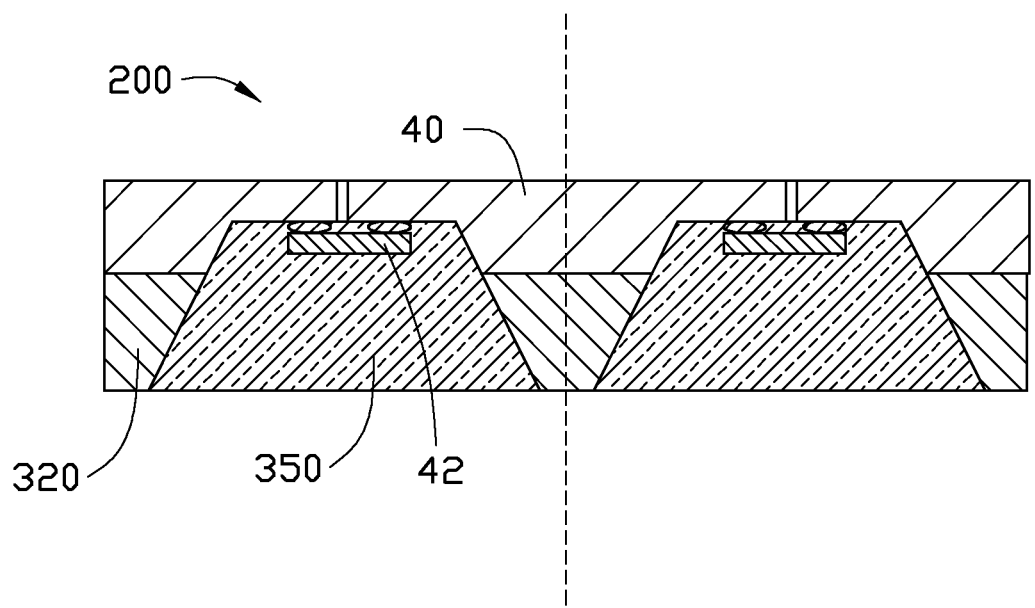
FIG. 13 is step 4 of the second embodiment of the light-emitting diode manufacturing method according to the present disclosure.

FIG. 13 and step 4 show: baking the flexible reflective layer 42 and the phosphor glue 35 at high temperature solidifying the flexible reflective layer 32 on the substrate 40 to form reflective cups 320 and the phosphor glue 35 is solidified on the surface of the LED chips 42 to form phosphor layer 350. When the substrate 40 combines with the flexible reflective layer 32, the LED chips 42 correspondingly embed into the phosphor glue 35. The phosphor glue 35 is deformed by the extrusion of the LED chips 42 to tightly attach with the LED chips 42. At the same time, the phosphor glue 35 is also extruded by the substrate 40 to combine with the substrate 40; therefore the connection between the phosphor glue 35 and the LED chips 42 and the substrate 40 can be improved. After solidifying the flexible reflective layer 32 and the phosphor glue 35, then the second supporting layer 34 is removed and the substrate 40 and the reflective cups 320 are cut to obtain light-emitting diodes 200. The processes of baking and cutting can refer to steps 7-8 of the first embodiment.

In the above embodiment, the reflective cups 120, 320 and the phosphor layer 150, 350 are formed by combining the flexible reflective layer 12, 32 and phosphor glue 15, 35 with the substrate 20, 40 and the LED chip 22, 42 and then being solidified. Thereby, in the light-emitting diodes 100, 200 that are obtained by above embodiments, the reflective cups 120, 350 and the phosphor layer 150, 350 combine tightly with the substrate 20, 40 and the LED chips 22, 42.

Since the phosphor layer and the reflective cup are formed by combining the flexible material layer and the hard material layer and then curing, moreover, during the process of combining, the LED chip is moved to insert into the phosphor glue and the flexible reflective layer is extruded to connect with the substrate, the mechanical connection and hermeticity between the cured phosphor layer and the LED chips, and the mechanical connection and hermeticity between the reflective cups and the substrate are improved; thus, the connections between the components are maximum tight; thus, peeling off of the reflective cups and phosphor layer from the substrate will not easily occur.

The above-mentioned embodiments of the present disclosure are intended to be illustrative only. Persons skilled in the art may devise numerous alternative embodiments without departing from the scope of the following claims.

What is claimed is:

1. A light-emitting diode manufacturing method, comprising the steps of:

providing a flexible layer, wherein the flexible material layer comprises a flexible reflective layer and phosphor glue;

providing a hard material layer, wherein the hard material layer comprises a substrate and at least one chip set on the substrate;

combining the flexible material layer an the hard material layer, wherein the at least one chip is brought to insert into the phosphor glue, the flexible reflective layer is extruded to connect with the substrate; and solidifying the flexible reflective layer and the phosphor glue to form at least one reflective cup surrounding the at least one chip and a phosphor layer receiving the at least one chip therein.

2. The light-emitting diode manufacturing method as claimed in claim 1, wherein the step of providing a flexible material layer comprising: providing a flexible reflective layer, on the flexible reflective layer opening at least one first cavity which penetrates the flexible reflective layer and filling the at least one first cavity with the phosphor glue.

3. The light-emitting diode manufacturing method as claimed in claim 2, wherein the step of providing a flexible material layer further comprises: forming a first supporting layer which overlays the surface of the flexible reflective layer prior to opening the at least one first cavity; and in the step of opening the at least one first cavity, the at least one first cavity also penetrates the first supporting layer.

4. The light-emitting diode manufacturing method as claimed in claim 3, wherein before filling with the phosphor glue, removing the first supporting layer and forming a second supporting layer on the other opposite surface of the flexible reflective layer, when filling with the phosphor glue, it is held by the second supporting layer.

5. The light-emitting diode manufacturing method as claimed in claim 1, wherein the substrate comprises at least one first protrusion which locates on the same surface with the at least one chip, when the flexible material layer combines with the hard material layer, the at least one first protrusion tenons into the flexible reflective layer.

6. The light-emitting diode manufacturing method as claimed in claim 5, wherein the at least one first protrusion has a shape of a ring which surrounds the at least one chip.

7. The light-emitting diode manufacturing method as claimed in claim 2, wherein the phosphor glue fills the at least one first cavity and protrudes to form a second protrusion above the at least one first cavity.

8. The light-emitting diode manufacturing method as claimed in claim 7, wherein the substrate further comprises a second cavity and the at least one chip locates in the second cavity, and when the flexible material layer combines the hard material layer, the second protrusion of the phosphor glue fills in the second cavity.

9. The light-emitting diode manufacturing method as claimed in claim 8, wherein the shape of the second protrusion of the phosphor glue is the same as the shape of the second cavity.

10. The light-emitting diode manufacturing method as claimed in claim 1, wherein the flexible reflective layer and the phosphor glue are cured by high temperature bake to form the at least one reflective cup and the phosphor layer, separately.

* * * * *